United States Patent
Nagarad et al.

(10) Patent No.: US 7,029,976 B1
(45) Date of Patent: Apr. 18, 2006

(54) METHOD FOR SONOS EFLASH INTEGRATED CIRCUIT

(75) Inventors: Sripad Sheshagiri Nagarad, Singapore (SG); Dong Kyun Sohn, Singapore (SG); Yoke Leng Louis Lim, Singapore (SG); Siow Lee Chwa, Singapore (SG); Hsiang Fang Lim, Singapore (SG)

(73) Assignee: Chartered Semiconductor Manufacturing. LTD, Singapore (SG)

( * ) Notice: Subject to any disclaimer, the term of this patent is extended or adjusted under 35 U.S.C. 154(b) by 0 days.

(21) Appl. No.: 11/041,051

(22) Filed: Jan. 21, 2005

(51) Int. Cl.
*H01L 21/8247* (2006.01)
(52) U.S. Cl. ...................................... 438/258; 438/954
(58) Field of Classification Search ........ 438/257–267, 438/954
See application file for complete search history.

(56) References Cited

U.S. PATENT DOCUMENTS

| | | | |
|---|---|---|---|
| 6,555,436 B1 * | 4/2003 | Ramsbey et al. | 438/279 |
| 6,730,564 B1 | 5/2004 | Ramsbey et al. | |
| 6,780,708 B1 * | 8/2004 | Kinoshita et al. | 438/241 |
| 6,835,662 B1 * | 12/2004 | Erhardt et al. | 438/689 |
| 2002/0192910 A1 | 12/2002 | Ramsbey | |
| 2004/0009645 A1 | 1/2004 | Yoo | |
| 2004/0014289 A1 | 1/2004 | Wu | |

* cited by examiner

*Primary Examiner*—Richard A. Booth
(74) *Attorney, Agent, or Firm*—William J. Stoffel

(57) ABSTRACT

A method of manufacturing a charge storage layer for a SONOS memory device. A feature of the embodiment is the first gate layer is formed over the charge storing layer (ONO) before the charge storing layer is patterned. The first gate layer protects the charge storing layer (ONO) from various etches used in the process to pattern the various gate dielectric layers on other regions of substrate.

12 Claims, 5 Drawing Sheets

US 7,029,976 B1

METHOD FOR SONOS EFLASH INTEGRATED CIRCUIT

BACKGROUND OF INVENTION

1) Field of the Invention

This invention relates generally to fabrication of non-volatile memory devices and to improved methods of fabricating SONOS type non-volatile memory devices.

2) Description of the Prior Art

Electrically erasable programmable non-volatile memory comes in different types, for example, EEPROM of a floating gate type, a metal-nitride-oxide-silicon (MNOS) type, a metal-oxide-nitride-oxide-silicon (MONOS) type, and a silicon-oxide-nitride-oxide-silicon (SONOS) type.

The SONOS-type EEPROM has a stacked structure typically comprising a lower oxide layer, a nitride layer, an upper oxide layer, and a polysilicon layer. The lower oxide layer is a tunnel oxide layer, the nitride layer 30 is a memory (storage) layer, and the upper oxide layer 40 is a blocking layer for preventing the loss of a stored charge. The polysilicon layer is a gate. The lower oxide layer, the nitride layer, the upper oxide layer, and the polysilicon layer are sequentially formed on a substrate in which isolation regions are formed. Source/drain regions are formed at both sides of the stacked structure in the substrate.

The SONOS-type EEPROM can be used in a compact semiconductor memory cell because it needs less voltage to program and erase than an EEPROM of the floating gate type. To achieve a more highly integrated SONOS-type EEPROM, the size of a memory cell needs to be reduced.

There is a challenge to produce SONOS devices with increase reliability.

Relevant technical developments in the patent literature can be gleaned by considering the following.

U.S. Patent Application 2002 0192910—A1—Ramsbey, Mark T.; et al. Dec. 19, 2002—Simultaneous formation of charge storage and bitline to wordline isolation—the patent forms a charge trapping dielectric over a substrate, the substrate having a core region and a periphery region; removing at least a portion of the charge trapping dielectric in the periphery region; forming a gate dielectric in the periphery region; forming buried bitlines in the core region; and forming gates in the core region and the periphery region.

U.S. Pat. No. 6,730,564 Ramsbey, et al.—Salicided gate for virtual ground arrays—shows a process for a SONOS. The patent appears to pattern the ONO layer before depositing the poly.

U.S. 20040014289 A1 Woo, Won Sic—Method for manufacturing semiconductor device and the device thereof—shows a process for MONOS/SONOS device.

U.S. Patent Application 20040009645 A1—Yoo, Taekwang—shows a EEPROM and method of fabricating the same a method of fabricating a SONOS-type EEPROM increases memory cell performance and reduces memory cell size.

SUMMARY OF THE INVENTION

An example embodiment of the present invention provides a method of manufacturing a memory device which is characterized.

providing a substrate having a logic region and a memory region;

forming a charge trapping layer over the substrate; the charge trapping layer comprised of any dielectric layers that can trap electron charges;

forming a first gate layer over the charge trapping layer;

patterning the first gate layer and the charge trapping layer to remove leave the first gate layer and the charge trapping layer only in the memory region; the first gate layer over the charge trapping layer in the memory region thereby protecting the charge trapping layer;

forming logic device comprised of a logic gate dielectric and a logic gate and logic source/drains in the logic region and a memory device comprised of the charge trapping layer, the first gate layer, and memory source/drain regions in the memory region.

Another example embodiment of the present invention provides a method of manufacturing a memory device which is characterized as follows:

providing a substrate having a cell region, a I/O region and a core region;

forming a charge trapping layer over the substrate; the charge trapping layer comprised of any dielectric layers that can trap electron charges;

forming a first gate layer over the charge trapping layer;

forming a logic mask over the cell region; the logic mask having openings over at least the core and I/O regions;

removing the top dielectric layer and the middle nitride layer in the core and I/O regions;

removing the logic mask;

removing the bottom dielectric layer to expose the substrate surface in the core and I/O regions;

forming a first gate dielectric layer over the core and I/O regions and over the first gate layer in the memory region;

forming a dual gate oxide mask at least over the first gate dielectric in the I/O region and the cell region;

etching the first gate dielectric layer to form an I/O gate dielectric layer over the I/O region;

the first gate layer over the charge trapping layer in the memory region thereby protecting the charge trapping layer;

removing the dual oxide mask; forming a second gate dielectric layer over the core region;

forming a second gate layer over the substrate;

forming an inverse logic mask over the second gate layer; the inverse logic mask covering the core and I/O regions;

removing the second gate layer and the first gate dielectric layer over the memory region;

patterning the second gate layer to form a core gate over the second gate dielectric layer in the core region, a I/O gate over the I/O gate dielectric over the I/O region and patterning the first gate layer and the charge storing layer to form a memory gate in the memory region.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

SONOS nonvolatile memories are close relatives of traditional floating-gate memories, but they replace the floating-gate with a thin silicon nitride film. The stored charge is localized in isolated sites within the silicon nitride dielectric, as opposed to a delocalized charge storage in the conductive polysilicon of a standard floating-gate. This is a key reliability advantage for SONOS. In a traditional floating-gate structure, if the oxide becomes permeable to charge, then the entire conductive floating-gate is discharged. In SONOS, only a few localized charge traps can be affected by a localized oxide failure, and information storage is degraded, but not destroyed.

I. Example Embodiment

Figure 1:
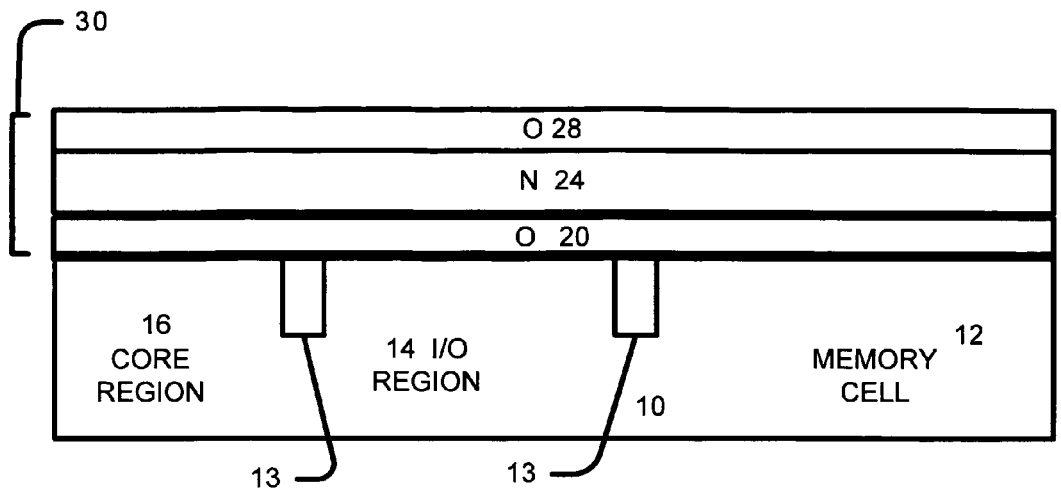
FIGS. 1 through 10 are cross sectional views for illustrating a method for manufacturing a memory device according to the present invention.
Figure 2:
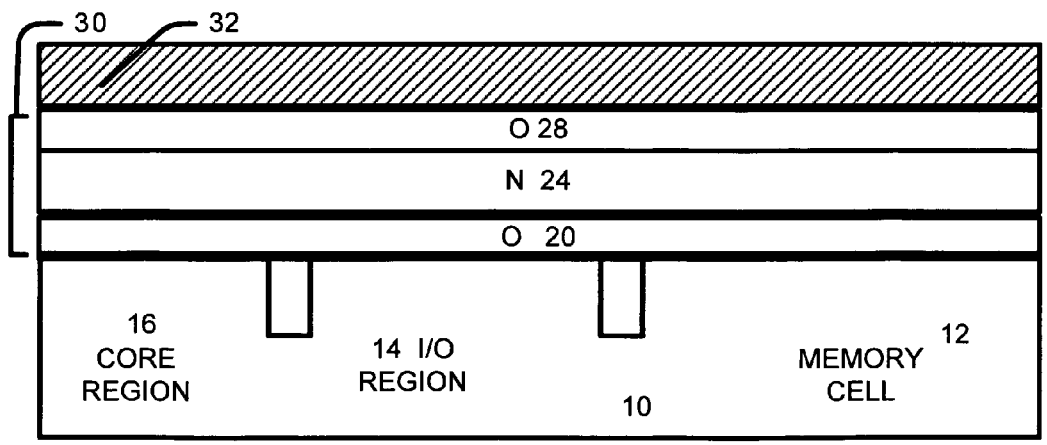
Figure 3:
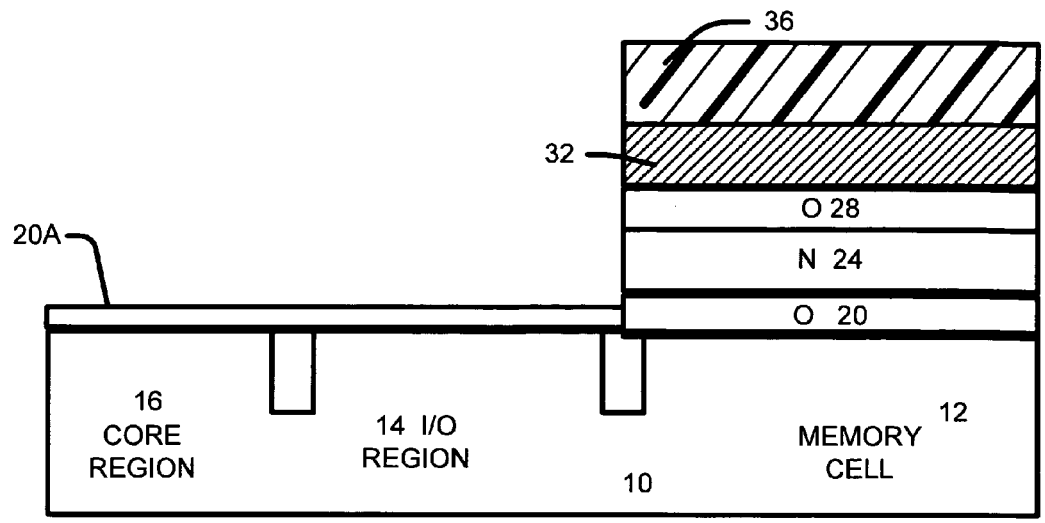
Figure 4:
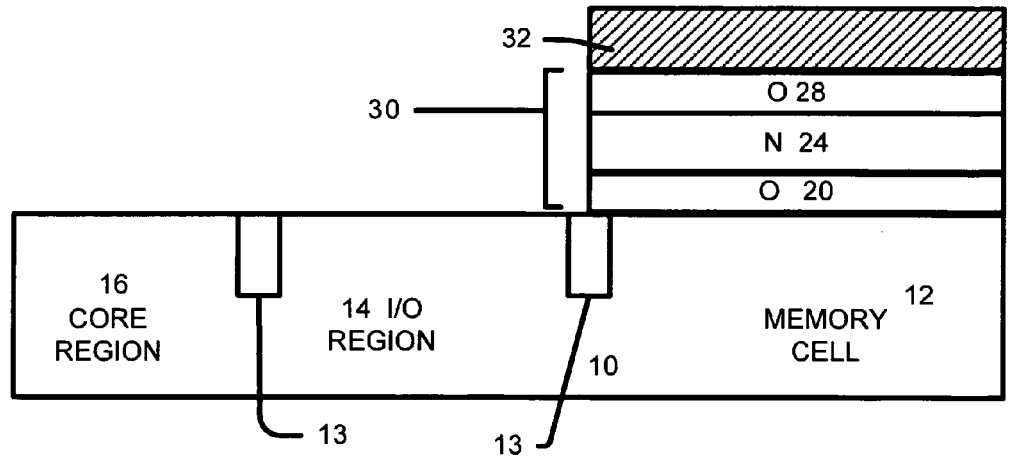

Referring generally to FIGS. 1 to 10, An example embodiment of a method of fabrication of a memory device, comprises the general steps of:

FIG. 1—providing a substrate 10 having a logic region (14 16) and a memory region;(SONOS cell region 12).

forming a charge trapping layer 30 (20 24 28) over the substrate; the charge trapping layer comprised of any dielectric layers that can trap electron charges;

FIG. 2—forming a first gate layer 32 over the charge trapping layer 30;

FIGS. 3 and 4 —patterning the first gate layer 32 and the charge trapping layer to remove leave the first gate layer 32 and the charge trapping layer only in the memory region; the first gate layer over the charge trapping layer in the memory region thereby protecting the charge trapping layer; 30

FIGS. 5 to 10—forming logic device (68C or 68B) comprised of a logic gate dielectric and a logic gate and logic source/drains in the logic region (14 or 16) and a memory device comprised of the charge trapping layer 30, the first gate layer 32, and memory source/drain regions in the memory region 12.

II. Another Example Embodiment

An example method of fabrication of a SONOS EFLASH device is shown in FIGS. 1 to 10. A feature of the embodiment is the polysilicon layer 32 is formed over the charge storing layer (ONO) 30 before the charge storing layer is patterned. The polysilicon layer 32 protects the charge storing layer (ONO) from various etches used in the process to pattern the various gate dielectric layers on other regions of substrate.

A. Substrate Having a Cell Region, a I/O Region and a Core Region

Referring to FIG. 1, we provide a substrate 10 having a cell region 12, a I/O region 14 and a core region 16. Isolation regions 13 preferably separate the regions.

The substrate is comprised of a peripheral or logic region (e.g., a I/O region 14 and a core region 16) and a memory region (SONOS cell region 12). The peripheral region can be any region other than the memory region 12. The peripheral region can include logic devices, such as low voltage gates, high voltage gates, and other input/output circuitry. Memory devices such as SONOS memory devices are formed in the memory region 12.

In the cell area, SONOS type memory devices can be formed. In the I/O region, thick gate dielectric devices and/or transistors can be formed. For example, thick gate dielectric devices (e.g., high V) can be formed in the I/O region. In the Core region 16, _thin gate dielectric of both n & p type devices can be formed. For example, thin gate dielectric devices (e.g., Low V) can be formed in the I/O region.

B. A Charge Trapping Layer

We form a charge trapping layer 30 (20 24 28) over the substrate. The charge trapping layer comprised of any dielectric layers that can trap electron charges.

The charge trapping layer is preferably comprised of a ONO trilayer (ONO-32 A/45A/45A) comprised of a bottom dielectric layer 20, a middle nitride layer 24 and a top dielectric layer 28.

The bottom dielectric layer is preferably comprised of oxide and has a thickness of between about 24 and 38 Å, the middle nitride layer and has a thickness of between about 40 and 80 Å and a top dielectric layer is comprised of oxide and has a thickness of between about 40 and 80 Å.

The above-mentioned range is the preferred range for the ONO layer dielectric for the SONOS cell to work.

The charge trapping dielectric can be any dielectric layer or layers that are capable of or facilitate electron trapping. For example, charge trapping dielectrics include an ONO trilayer dielectric, Although the term SONOS is suggestive of an ONO layer, as used herein the term encompasses nonvolatile memory devices containing any of the charge trapping dielectric. In other words, a SONOS type nonvolatile memory device contains any dielectric layer or layers that are capable of or facilitate electron trapping, and does not require an ONO charge trapping dielectric.

Where the charge trapping dielectric is an ONO dielectric, one or both of the silicon dioxide layers can be a silicon-rich silicon dioxide layer. One or both of the silicon dioxide layers can also be an oxygen-rich silicon dioxide layer. One or both of the silicon dioxide layers can be a thermally grown or a deposited oxide. One or both of the silicon dioxide layers can be nitrided oxide layers. Nitride Layer can be graded such that Si rich near Bottom oxide & Nitrogen rich near Top Oxide. Nitride layer can be nitrogen rich alone or Si rich alone. Top oxide can be formed by Low Pressure Chemical Vapour Deposition(e.g., High Temperature Oxide (HTO)) or by a thermal oxide (e.g., pure dry oxide or wet oxide)or by a rapid thermal oxidation(e.g., dry or low pressure wet oxidation such as ISSG(In-situ Steam Generation)). In case of ISSG Top oxide, as deposited nitride layer should be thick enough to achieve the desired target of final nitride thickness as ISSG oxidation consumes the nitride layer.

C. Form a First Gate Layer Over the Charge Trapping Layer

As shown in FIG. 2, we form a first gate layer 32 over the charge trapping layer 30. The first gate layer 32 can be comprised of polysilicon, metal, a polycide or a doped poly silicon layer (doped with n and/or p type Implants). The layer 32 preferably has thickness of between about 1800 and 2200 Å.

D. Form a Logic Mask Over the Cell Region

As shown in FIG. 3, we form a logic (ONO) mask 36 (e.g., resist) over the cell region 12. The logic mask 36 has openings over at least the logic region 14 16.

E. Remove the Top Dielectric Layer and the Middle Nitride Layer Using an Etch

As shown in FIG. 3, we remove the top dielectric layer and the middle nitride layer and preferably a portion (or all) of bottom dielectric layer not over the memory cell regions 12 (e.g., regions 14 16) of the using an etch.

The remnant bottom dielectric layer 20A over the I/O region 14 and core region 16 preferably has a thickness of between about 0 and 20 Å.

There is a concern over the removal of bottom oxide layer during nitride etch is the silicon pitting. Hence the wet etch is preferred compared to dry etch.

As shown in FIG. 4, we remove the logic (ONO) mask 36 using a photoresist strip process and we remove the remnant bottom dielectric layer 20A.

F. Remove the Bottom Dielectric Layer Using an Etch Process

We remove the bottom dielectric layer 20 preferably using an etch process, such as a dilute HF etch followed by SC1 & SC2 clean step. The "SC1 & SC2" are basically a RCA Clean. The clean provided can be considered thus as "DHF+RCA". The RCA clean also cleans the substrate surface.

The "RCA clean" process which uses a first solution of ammonium hydroxide, hydrogen peroxide, and water and a second solution of hydrochloric acid, hydrogen peroxide, and water. The RCA cleaning solutions typically are mixed in separate tanks. The wafers are first subjected to cleaning by the ammonium hydroxide solution, then are moved to a rinse tank, then to a tank containing the hydrochloric acid cleaning solution, and then to a final rinse tank.

G. Form a First Gate Dielectric Layer

Figure 5:
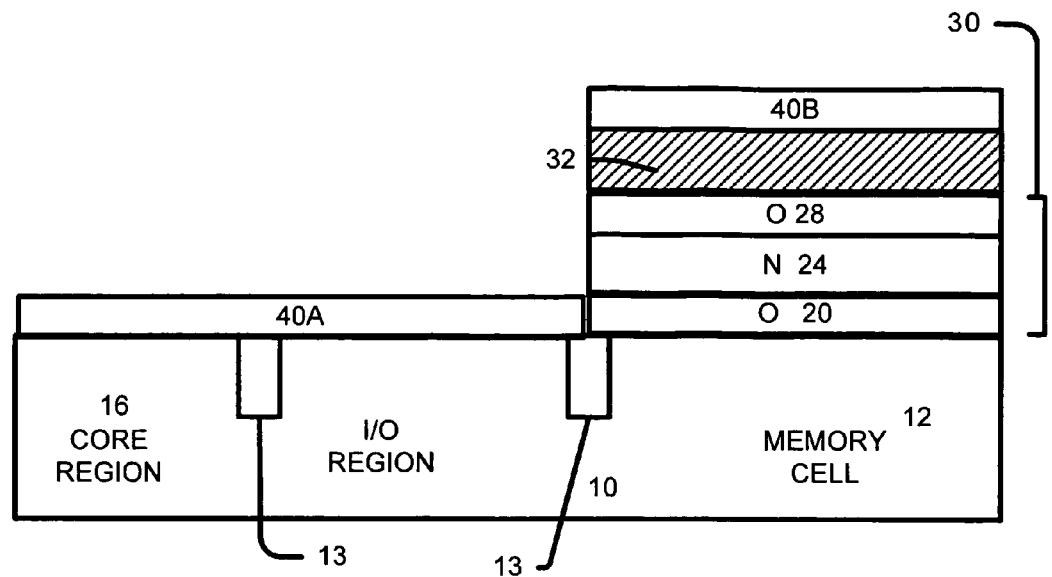

Referring to FIG. 5, we form a first gate dielectric layer 40A 40B (e.g., I/O gate dielectric, or thick gate dielectric) over the logic region 14 16 and (first gate dielectric 40B) over the first gate layer 32.

The first gate dielectric layer 40A 40B (e.g., thick gate dielectric) In the I/O region 14 will be used to as a gate dielectric for the I/O devices in the I/O region 14.

H. Form a Dual Gate Oxide Mask

Figure 6:
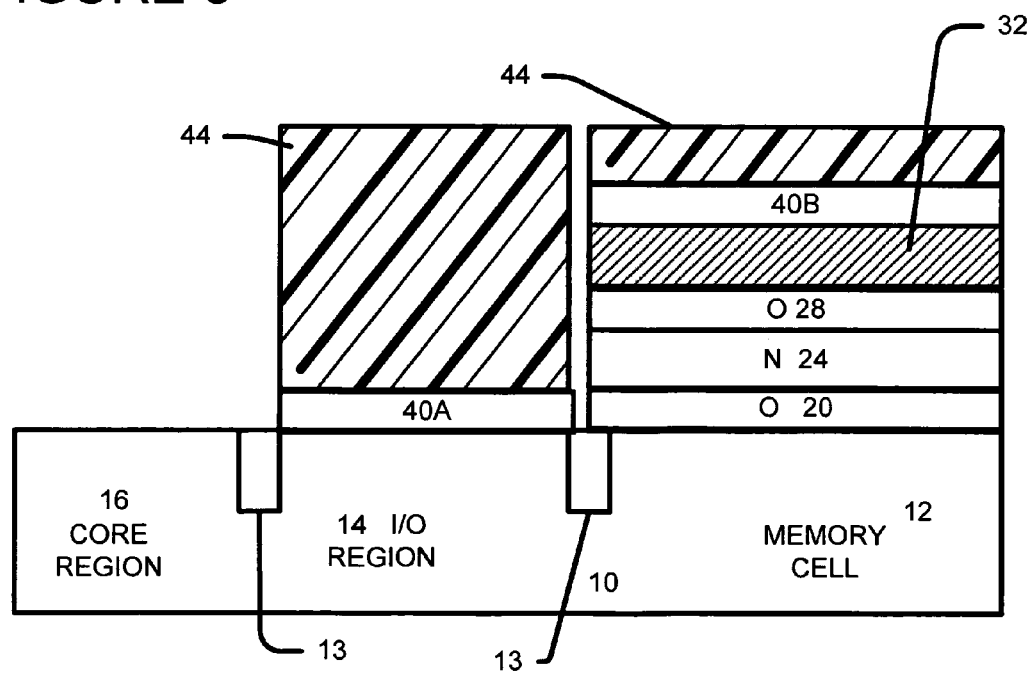

As shown in FIG. 6, we form a dual gate oxide mask 44 over the first gate dielectric 40 in the I/O region 14 and the cell region 12.

I. Etch the First Gate Dielectric Layer to Form an I/O Gate Dielectric

We then etch the first gate dielectric layer 40 to form a I/O gate dielectric 40C over the I/O region 14.

We remove the dual oxide mask 44.

J. Form a Second Gate Dielectric Layer Over the Core Region

Figure 7:
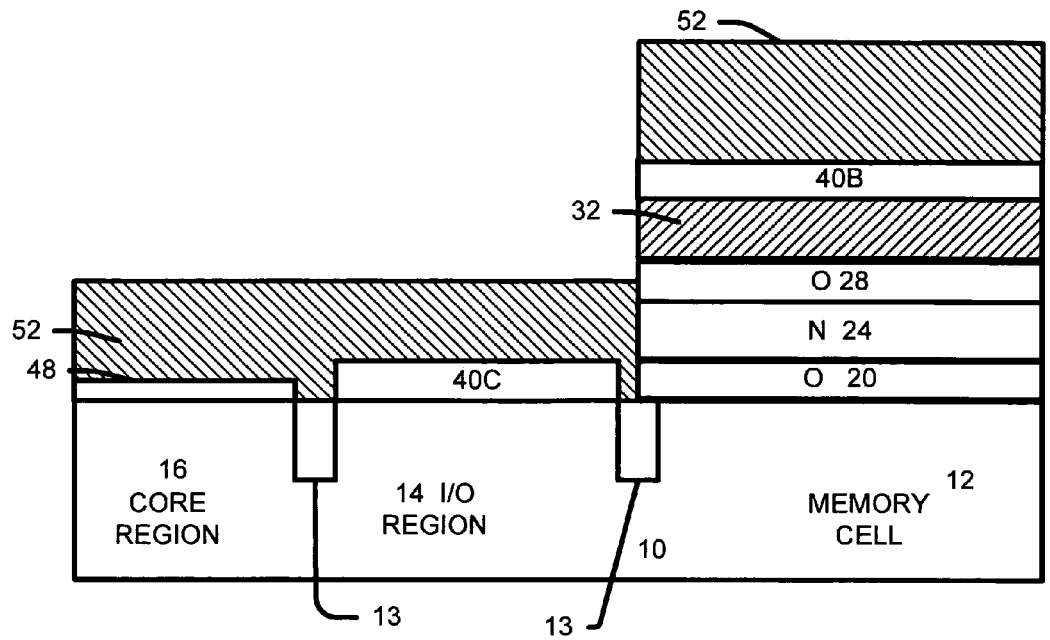

As shown in FIG. 7, we form a second gate dielectric layer 48 (e.g., thin gate oxide) over the core region 16. The second gate dielectric layer 48 will be used as a gate dielectric layer in the core region 16.

K. Form a Second Gate Layer Over the Substrate

Referring to FIG. 7, we form a second gate (e.g., polysilicon) layer 52 over the substrate 10.

L. Form a Reverse Logic (ONO) Mask Over the Second Gate Layer

Figure 8:
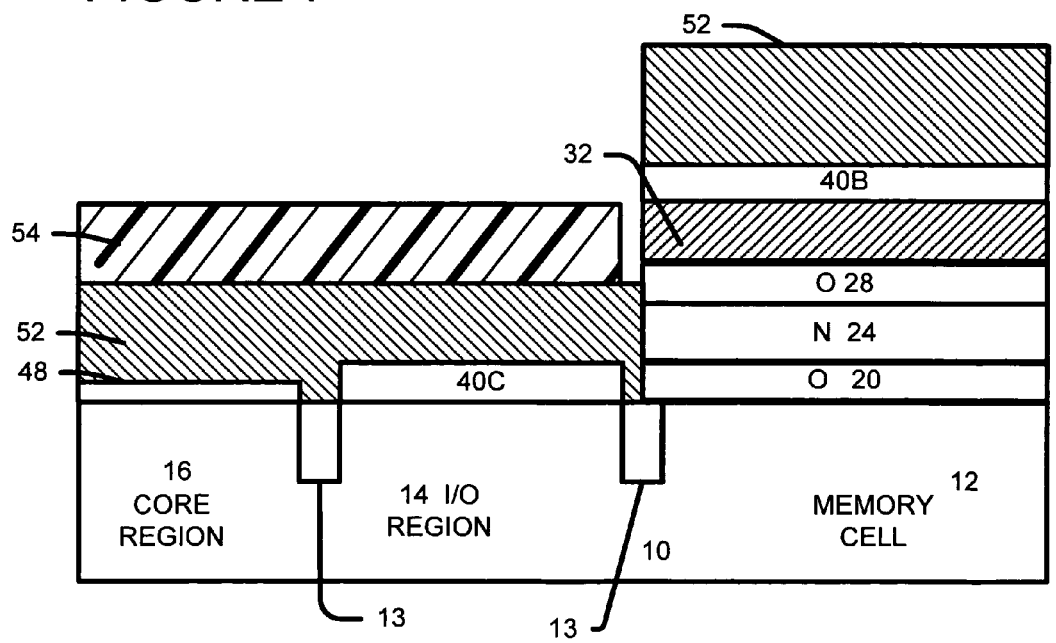

As shown in FIG. 8, we form a reverse logic (ONO) mask 54 over the second gate layer 52. The reverse logic mask 54 preferably covers the active areas in the peripheral (logic) regions 14 16 preferably except the area of poly bridge between ONO dielectric & the I/O region. This portion of second gate layer (e.g., poly) 52 between the I/O gate dielectric layer 40C and bottom dielectric layer 20 will be etched during the second gate layer 52 etch.

Figure 9:
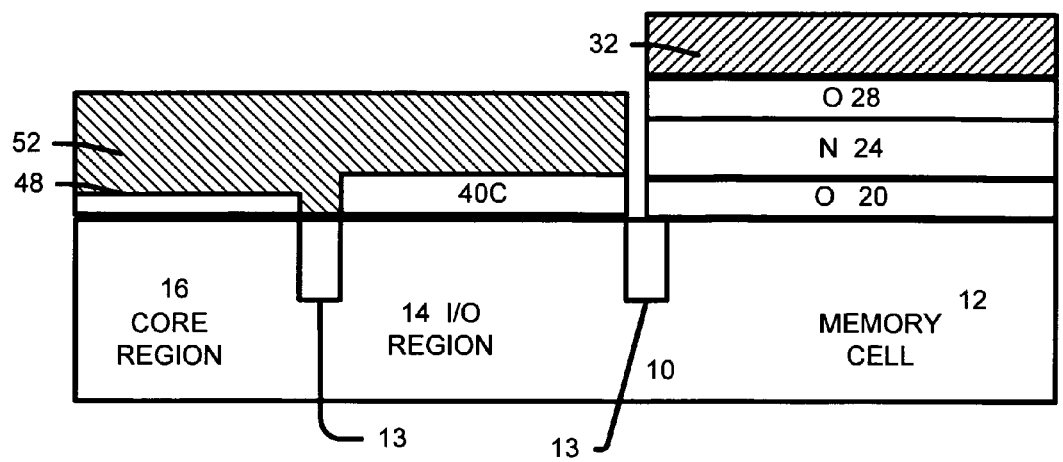

M. Remove the Second Gate Layer and the First Gate Dielectric Over the Cell Region As shown in FIG. 9, we remove the second gate (e.g., polysilicon) layer 52 and the first gate dielectric 40B over the cell region 12. This exposes the top of the first gate layer 32. Also, preferably there is a gap between the second gate (e.g., polysilicon) layer 52 and the charge trapping layer (20 24 28).

Then we removed the logic mask 36.

N. Perform a RCA Clean

As shown FIG. 9, we can perform an etch and a clean process (e.g., "DHF+RCA" clean) to remove an oxide layer on polysilicon 52. The oxide can have a thickness of about ~30A.

O. Form a Logic Device and a Memory Device

Figure 10:
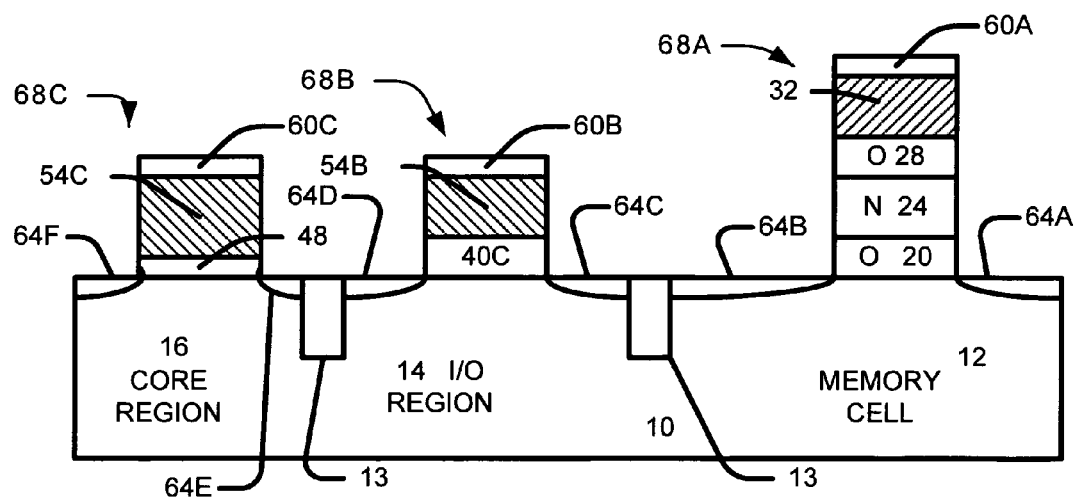

FIG. 10 shows three transistors: memory transistor 68A in memory area 12, I/O transistor 68B in the I/O area 14 and core transistor 68C in the core area 16.

In an example aspect, the second gate layer 52 is patterned to form I/O gate 54B over the I/O gate dielectric 40C over the I/O region 14 and a core gate 54C over the second gate dielectric layer 48. Next silicide regions (memory silicide region 60A, I/O silicide region 60B and core silicide region 68C) are formed on the memory gate 32, the I/O gate 54B and the core gate 54C. Source/drain regions (memory S/D regions 64A 64B, I/O S/D regions 64C 64D, and core S/D regions 64E 64F are formed adjacent their respective gates.

III. Features of the Example Embodiment

The embodiments provide for the following.

Better top dielectric (ISSG oxide or HTO Oxide) 28 integrity due to the protection of the degradation of the TOP oxide 28 by 2 RCA cleans. This in turn results superior endurance (<10K) & data retention Easy to monitor the final nitride 24 thickness using HTO oxidation method since HTO process doesn't consume the nitride layer. On the other hand final nitride thickness monitor is difficult for ISSG oxidation Method due to run to run variation of Incoming as deposited nitride thickness. Leaving aside the final nitride thickness fluctuation, ISSG Method can still give consistent Top oxide thickness Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a memory device, comprising the steps of:
   a) providing a substrate having a logic region and a memory region;
   b) forming a charge trapping layer over the substrate; said charge trapping layer comprised of any dielectric layers that can trap electron charges;
   c) forming a first gate layer over the charge trapping layer;
   d) patterning said first gate layer and the charge trapping layer to leave said first gate layer and the charge trapping layer only in said memory region; said first gate layer over said charge trapping layer in said memory region thereby protecting said charge trapping layer;
   e) forming logic device comprised of a logic gate dielectric and a logic gate and logic source/drains in said logic region and a memory device comprised of said charge trapping layer, said first gate layer, and memory source/drain regions in said memory region.

2. The method of claim 1 wherein in the memory area, SONOS type memory device are formed; in the logic regions thick dielectric I/O devices or thin gate dielectric NMOS and PMOS type device are formed.

3. The method of claim 1 wherein said charge trapping layer is comprised of a bottom dielectric layer, a middle nitride layer and a top dielectric layer.

4. The method of claim 1 wherein said charge trapping layer is comprised of an Oxide-Nitride-Oxide tri-layer comprised of a bottom dielectric layer, a middle nitride layer and a top dielectric layer;
   said bottom dielectric layer comprised of oxide has a thickness of between about 24 and 38 Å, the middle nitride layer has a thickness of between about 40 and 80 Å and a top dielectric layer comprised of oxide has a thickness of between about 40 and 80 Å.

5. A method of fabrication of a SONOS EFLASH device, comprising the steps of:
   a) providing a substrate having a cell region, a I/O region and a core region;
   b) forming a charge trapping layer over the substrate; said charge trapping layer comprised of any dielectric layers that can trap electron charges; (1) said charge trapping layer is comprised of an Oxide-Nitride-Oxide tri-layer comprised of a bottom dielectric layer, a middle nitride layer and a top dielectric layer;
   c) forming a first gate layer over the charge trapping layer;
   d) forming a logic mask over said cell region; said logic mask having openings over at least said core and I/O regions;
   e) removing said top dielectric layer and said middle nitride layer in said core and I/O regions;
   f) removing said logic mask;
   g) removing said bottom dielectric layer to expose the substrate surface in said core and I/O regions;
   h) forming a first gate dielectric layer over said core and I/O regions and over said first gate layer in said memory region;
   i) forming a dual gate oxide mask at least over said first gate dielectric in said I/O region and said cell region;
   j) etching said first gate dielectric layer to form an I/O gate dielectric layer over said I/O region;
      said first gate layer over said charge trapping layer in said memory region thereby protecting said charge trapping layer;
   k) removing said dual oxide mask;
   l) forming a second gate dielectric layer over said core region;
   m) forming a second gate layer over said substrate;
   n) forming an inverse logic mask over said second gate layer; said inverse logic mask covering said core and I/O regions;
   o) removing said second gate layer and said first gate dielectric layer over said memory region;
   p) patterning said second gate layer to form a core gate over said second gate dielectric layer in said core region, a I/O gate over said I/O gate dielectric over said I/O region and patterning said first gate layer and said charge storing layer to form a memory gate in said memory region.

6. The method of claim 5 wherein in the cell area, SONOS type memory device are formed, in the I/O region, thick dielectric I/O devices are formed, and in the Core region, thin gate dielectric NMOS and PMOS type device are formed.

7. The method of claim 5 wherein said charge trapping layer is comprised of an Oxide-Nitride-Oxide tri-layer comprised of a bottom dielectric layer, a middle nitride layer and a top dielectric layer;
   said bottom dielectric layer comprised of oxide has a thickness of between about 24 and 38 Å, the middle nitride layer has a thickness of between about 40 and 80 Å and a top dielectric layer comprised of oxide has a thickness of between about 40 and 80 Å.

8. The method of claim 5 wherein the step of removing said bottom dielectric layer to expose the substrate surface in said core and I/O regions; further includes performing an RCA clean to clean the substrate surface.

9. The method of claim 5 wherein the last step comprises:
   removing said reverse logic mask with openings over at least said memory region;
   performing a RCA clean of the exposed surfaces;
   forming salicide region on said core gate, said I/O gate, said memory gate;
   forming source and drain regions adjacent said core gate, said I/O gate, said memory gate.

10. A method of fabrication of a SONOS EFLASH device, comprising the steps of:
    a) providing a substrate having a memory region, a I/O region and a core region;
       (1) in the memory area, SONOS type memory device are formed; in the I/O region, thick dielectric I/O devices are formed; and in the core region, thin gate dielectric NMOS and PMOS type device are formed;
    b) forming a charge trapping layer over the substrate; said charge trapping layer comprised of any dielectric layers that can trap electron charges;
       (1) said charge trapping layer is comprised of an Oxide-Nitride-Oxide tri-layer comprised of a bottom dielectric layer, a middle nitride layer and a top dielectric layer;

c) forming a first gate layer over the charge trapping layer; said first gate layer is comprised of polysilicon;
d) forming a logic mask over said memory region; said logic mask having openings over at least said core and I/O regions;
e) removing said top dielectric layer and said middle nitride layer in said core and I/O region using an etch;
f) removing said logic mask;
g) removing said bottom dielectric layer to expose the substrate surface in said core and I/O regions;
h) forming a first gate dielectric layer over said core and I/O regions and over said first gate layer;
i) forming a dual gate oxide mask over said first gate dielectric in said I/O region and said memory region;
j) etching said first gate dielectric layer to form a I/O gate dielectric layer over said I/O region;
k) removing said dual oxide mask;
l) forming a second gate dielectric layer over said core region;
m) forming a second gate layer over said substrate;
n) forming an inverse logic mask over said second gate layer; said inverse logic mask covering said core and said I/O regions;
o) removing said second gate layer and said first gate dielectric layer over said memory region;
p) removing said inverse logic mask;
q) patterning said second gate layer to form a core gate over said second gate dielectric layer in said core region, a I/O gate over said I/O gate dielectric over said I/O region and patterning said first gate layer and said charge storing layer to form a memory gate in said memory region;
r) forming salicide region on said core gate, said I/O gate, said memory gate;
s) forming source and drain regions adjacent said core gate, said I/O gate, and, said memory gate.

11. The method of claim 10 wherein said bottom dielectric layer comprised of oxide has a thickness of between about 24 and 38 Å, the middle nitride layer has a thickness of between about 40 and 80 Å and a top dielectric layer comprised of oxide has a thickness of between about 40 and 80 Å.

12. The method of claim 10 wherein the step of removing said bottom dielectric layer to expose the substrate surface in said core and I/O regions; further includes performing an RCA clean to clean the substrate surface.

* * * * *